United States Patent [19]
Tang

[11] Patent Number: 5,482,896
[45] Date of Patent: Jan. 9, 1996

[54] LIGHT EMITTING DEVICE COMPRISING AN ORGANIC LED ARRAY ON AN ULTRA THIN SUBSTRATE AND PROCESS FOR FORMING SAME

[75] Inventor: Ching W. Tang, Rochester, N.Y.

[73] Assignee: Eastman Kodak Company, Rochester, N.Y.

[21] Appl. No.: 154,368

[22] Filed: Nov. 18, 1993

[51] Int. Cl.$^6$ ............................................. H01L 21/60
[52] U.S. Cl. ........................ 437/209; 437/3; 437/23; 437/211; 437/905; 437/906; 437/2; 148/DIG. 99
[58] Field of Search ............................ 437/209, 211, 437/214, 215, 217, 218, 219, 220, 2, 3, 23, 974, 905, 906; 148/DIG. 99, DIG. 135

[56] References Cited

U.S. PATENT DOCUMENTS

| | | | |
|---|---|---|---|
| 3,947,840 | 3/1976 | Craford et al. | 148/DIG. 99 |
| 4,356,429 | 10/1982 | Tang . | |
| 4,539,507 | 9/1985 | Van Slyke et al. . | |
| 4,720,432 | 1/1988 | Van Slyke et al. . | |
| 4,769,292 | 9/1988 | Tang et al. . | |
| 4,885,211 | 12/1989 | Tang et al. . | |
| 4,933,601 | 6/1990 | Sagawa et al. | 437/23 |
| 4,950,950 | 8/1990 | Perry et al. . | |
| 5,043,296 | 8/1991 | Hacke et al. . | |
| 5,047,687 | 9/1991 | Van Slyke . | |
| 5,059,861 | 10/1991 | Littman et al. . | |
| 5,059,862 | 10/1991 | Van Slyke et al. . | |
| 5,061,569 | 10/1991 | Van Slyke et al. . | |
| 5,071,787 | 12/1991 | Mori et al. | 437/209 |
| 5,073,446 | 12/1991 | Scozzafava et al. . | |
| 5,110,748 | 5/1992 | Sarma | 437/974 |
| 5,171,712 | 12/1992 | Wang et al. | 437/974 |
| 5,254,480 | 10/1993 | Tran | 437/2 |
| 5,288,944 | 2/1994 | Bronson et al. | 437/209 |
| 5,317,236 | 5/1994 | Zavracky et al. | 148/DIG. 135 |

FOREIGN PATENT DOCUMENTS 349265  6/1989  European Pat. Off. .

Primary Examiner—Kevin M. Picardat
Attorney, Agent, or Firm—Raymond L. Owens

[57] ABSTRACT

A light emitting device that comprises an organic LED array containing a plurality of light emitting pixels, the pixels each being located on a common electrically insulative transparent substrate, is characterized in that the transparent support is ultra thin, having a thickness less than the pitch of the pixels. The pixels in the LED array can be arranged in intersecting columns and rows, or they can comprise a line array. A process for forming a light emitting device on an ultra thin transparent substrate comprises the following steps: (a) releasably laminating to an ultra thin electrically insulating transparent substrate a relatively thick rigid temporary support; (b) forming the LED array on the ultra thin substrate; (c) forming on a relatively thick rigid permanent support an electrical conductor patterned in conformity with the first electrode element and the second electrode element on the ultra thin substrate; (d) forming an array of electrically conductive malleable bonding bumps on the patterned electrical conductor located on the permanent support; (e) aligning the first and second electrode elements in correct registration with the patterned electrical conductor; (f) contacting the bonding bumps on the electrical conductor with the first and second electrode elements; (g) forming a physical and electrical connection between the bonding bumps and the first and second electrode elements; and (h) delaminating the temporary support from the ultra thin transparent substrate. Additionally, a transparent and electrically insulative sealant material can be introduced into the space between the ultra thin substrate and the electrical conductor on the permanent support.

20 Claims, 3 Drawing Sheets

LIGHT EMITTING DEVICE COMPRISING AN ORGANIC LED ARRAY ON AN ULTRA THIN SUBSTRATE AND PROCESS FOR FORMING SAME

FIELD OF THE INVENTION

This invention relates to a light emitting device comprising an organic light-emitting diode (LED) array, and more particularly to a device comprising an organic LED array on an ultra thin transparent substrate and a process for forming the device.

BACKGROUND OF THE INVENTION

Organic LED arrays are typically employed as display devices, but they can also serve as light sources for digital printing on photographic films and papers. For such applications, the print head would ordinarily utilize a projection element for focusing the LED light source onto the photosensitive element. This projection element can consist of a single lens or an array of lenslets. However, because the radiant output of an organic LED array is somewhat limited, it is important that any projection element so employed have very high light gathering efficiency. Otherwise the quality of the digitally printed photographic image would be significantly compromised.

PROBLEM TO BE SOLVED BY THE INVENTION

To avoid light gathering inefficiency, an organic LED array on an ultra thin transparent substrate fabricated in accordance with the process of the invention can be utilized in direct contact printing. This obviates the need for a projection element such as a lens and ensures the highest possible light collection efficiency.

SUMMARY OF THE INVENTION

A light emitting device that comprises an organic LED array containing a plurality of light emitting pixels having a predetermined pitch; a plurality of light transmissive first electrode elements located on a common electrically insulative transparent substrate, each first electrode element being laterally spaced and electrically insulated from an adjacent first electrode element; an organic electroluminescent medium located on a supporting surface formed by the substrate and every first electrode element; and a second electrode element located on the organic electroluminescent medium, the pixels each including a first electrode element and a second electrode element, is characterized in that the electrically insulative transparent support is ultra thin, having a thickness less than the pitch of the pixels.

In one embodiment of the invention, the pixels of the device are arranged in a plurality of intersecting columns and rows; the pixels in each column contain and are joined by a common first electrode element; and the pixels in each row contain and are joined by a common second electrode element, each second electrode element being laterally spaced and electrically insulated from an adjacent second electrode element.

In another embodiment of the invention, the pixels of the device are arranged in a line array.

A process for forming a light emitting device on an ultra thin transparent substrate comprises the following steps: (a) releasably laminating to an ultra thin electrically insulating transparent substrate a relatively thick rigid temporary support; (b) forming the LED array on the ultra thin substrate; (c) forming on a relatively thick rigid permanent support an electrical conductor patterned in conformity with the first and second electrode elements located on the substrate; (d) forming an array of electrically conductive malleable bonding bumps on the patterned electrical conductor located on the permanent support; (e) aligning the first and second electrode elements located on the ultra thin substrate in correct registration with the patterned electrical conductor located on the permanent support; (f) contacting the bonding bumps on the electrical conductor with the first and second electrode elements; (g) forming a physical and electrical connection between the bonding bumps and the first and second electrode elements; and (h) delaminating the temporary support from the ultra thin transparent substrate. Additionally, a transparent and electrically insulative sealant material can be introduced into the space between the ultra thin substrate and the electrical conductor on the permanent support.

ADVANTAGES OF THE INVENTION

Use of an ultra thin transparent substrate whose thickness dimension is small relative to the lateral dimensions of a pixel of the LED array enables the light-emitting surface of the array to be brought into close proximity to the photosensitive receptors of a photographic material, resulting in excellent optical coupling and minimum image distortion.

Since dimensions of features of the device are frequently in the sub-micrometer range, the drawings are scaled for ease of visualization rather than dimensional accuracy.

DETAILED DESCRIPTION OF THE INVENTION

A light emitting device fabricated according to the process of the invention contains an organic LED array formed on an ultra thin substrate. This LED array can serve as a light source useful for direct contact printing on photographic, electrophotographic, and other photosensitive materials without the need for a projection lens system. Because the light source and the receptor medium can be as close as about 10 µm apart, extremely high resolution printing is possible. In addition, there are potential savings in the manufacturing costs of a printhead that requires no lens.

The fabrication process of the invention is illustrated by FIGS. 1–10. The figures depict an LED array containing a single row of pixels. Such a line array is useful for digital printing applications. However, an LED array in which the pixels are arranged in a plurality of columns and rows is also contemplated as an embodiment of the invention.

Figure 1:
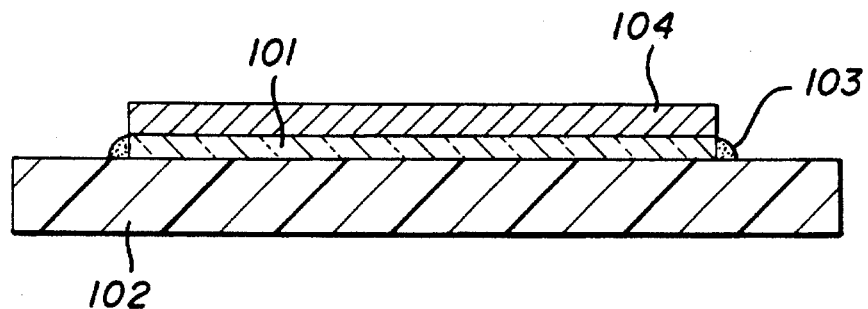
FIG. 1 is a schematic cross-sectional view depicting a first electrode deposited on an ultra thin substrate that has been laminated to a temporary support.

FIG. 1 depicts a releasably laminated ultra thin transparent substrate 101 on a relatively thick rigid temporary support 102. For this purpose, an adhesive 103 can be employed. Suitable adhesives for this purpose include, for example, low temperature or hot melt adhesives.

The ultra thin substrate 101 is preferably glass, with a thickness of up to about 150 µm, preferably between about 25 µm and 50 µm. Glass having these characteristics is commercially available from Schott Glass Corporation and other vendors. An ultra thin plastic substrate can also be used, provided that it has dimensional and chemical stability properties compatible with fabrication of the organic LED array.

The rigid temporary support 102 can be glass or other insulating materials. Suitable thicknesses for this support are about 1 mm to 3 mm.

FIG. 1 also depicts the application of a light transmissive, preferably transparent, first electrode 104 applied to the surface of the substrate 101. Most commonly used for this purpose is indium tin oxide, applied by conventional methods such as sputtering. A suitable thickness for an indium tin oxide first electrode is from about 1000 Å to 4000 Å, preferably about 300 Å fix to 2500 Å.

Figure 2:
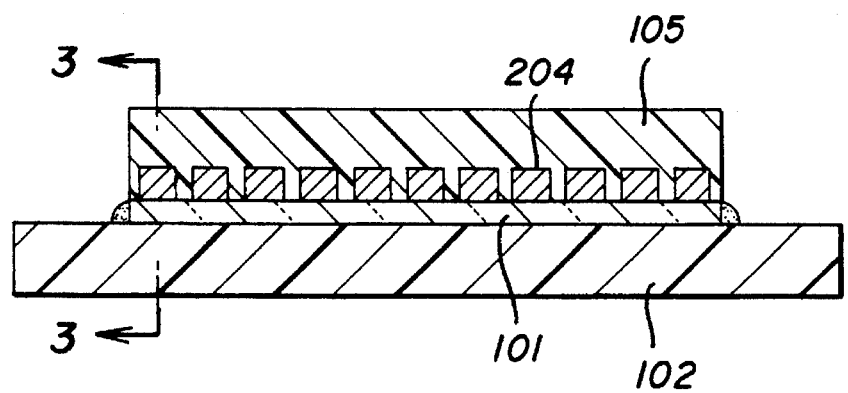
FIG. 2 is a schematic cross-sectional view of the structure of FIG. 1 following patterning of the first electrode to form first electrode elements and application of a dielectric layer.

FIG. 2 illustrates the first electrode patterned into first electrode elements 204. Conventional photofabrication methods, such as photoresist patterning followed by etching of unprotected indium tin oxide areas with hydriodic or hydrochloric acid, followed in turn by removal of the photoresist and rinsing, can be employed.

The first electrode elements 204 have a spatial resolution of about 100 to 500 dots per inch (dpi), which is suitable for printing applications. Spatial resolution is the reciprocal of pixel pitch, which is defined as the lateral distance between adjacent pixels. Thus, spatial resolutions of 100 and 500 dpi correspond to pixel pitch dimensions of approximately 250 µm and 50 µm, respectively. Conversely, a pitch of 150 µm corresponds to resolution of about 170 dpi.

Also shown in FIG. 2 is a deposited dielectric layer 105, which can be a positive-working or negative-working photoresist material or suitable inorganic dielectric material such as $SiO_2$, $Al_2O_3$, $Si_3N_4$, and the like. The dielectric layer 105 can comprise a single layer or multiple layers having a total thickness of about 0.1 µm to 5 µm, preferably about 0.25 µm to 1 µm.

Figure 3:
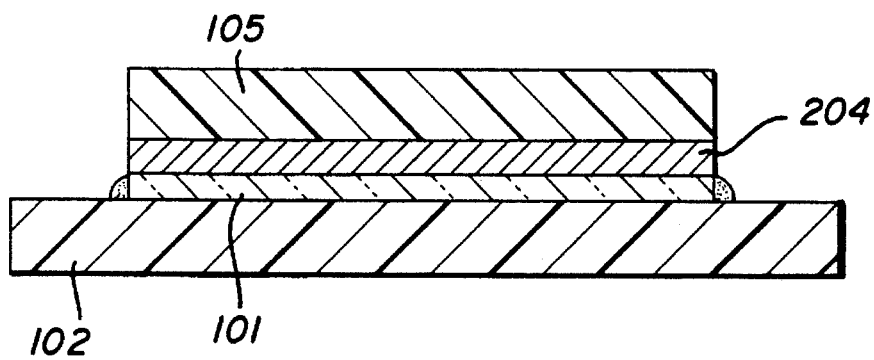
FIG. 3 is a schematic cross-sectional view along line 3—3 of FIG. 2.

FIG. 3 is a section view along line 3—3 in FIG. 2; it shows only one of the first electrode elements 204.

Figure 4:
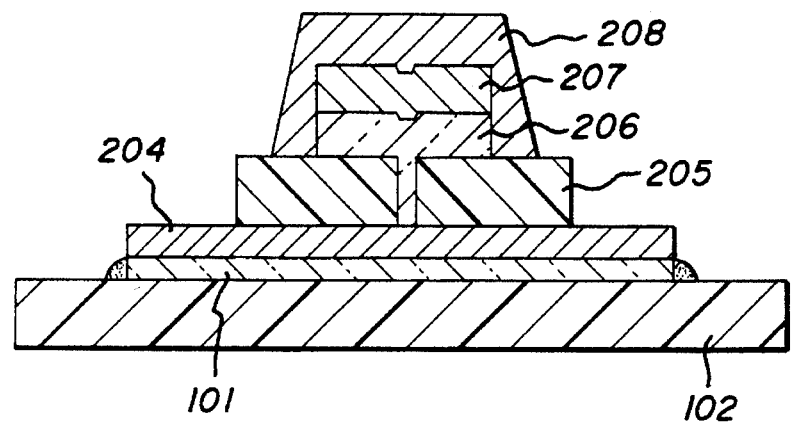
FIG. 4 is a schematic cross-sectional view of the structure of FIG. 3 following patterning of the dielectric layer and application of an organic electroluminescent (EL) medium, a second electrode element, and a capping layer.
Figure 6:
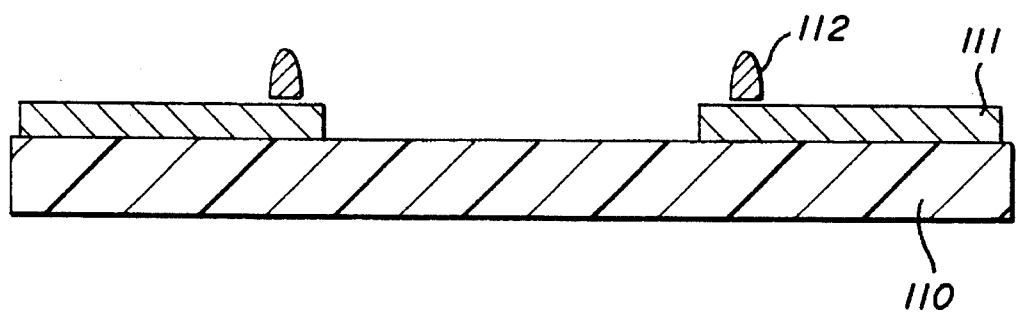
FIG. 6 is a schematic cross-sectional view of a structure containing bonding bumps on a patterned electrical conductor located on a permanent support.

The dielectric layer 105 can be patterned by conventional photofabrication and etching techniques to define the LED pixel areas and provide openings for electrical contacts, as represented by the patterned dielectric layer 205 in the cross-sectional view depicted in FIG. 4. Also shown in FIG. 4 are the organic electroluminescent (EL) medium 206, the second electrode element 207, and the desiccant and capping layer 208, applied sequentially to the patterned dielectric layer 205 by vacuum deposition using shadow masks. Construction of the second electrode element 207 and application of the EL medium 206 and the desiccant and capping layer 208 is carried out in such manner as to allow openings for the subsequent connection of the second electrode element to the electrical conductor, as shown in FIG. 6.

The organic EL medium 206 can comprise one or more layers and can be deposited by conventional vapor deposition techniques. Its thickness, even in multilayer form, is considerably less than 1 µm and is typically less than 0.5 µm. Preferably, the organic EL medium consists of a hole injection and transporting zone and an electron injecting and transporting zone. More preferably, the hole injecting and transporting zone comprises a hole injecting layer adjacent to the anode of the device and a hole transporting layer, and the electron injecting and transporting zone comprises an electron injecting layer adjacent to the cathode and an emitting layer in which hole and electron recombination occurs. In a preferred construction, first electrode elements form the anode and second electrode elements form the cathode of the device.

Suitable materials for the EL medium 206 for a device fabricated in accordance with the present invention are disclosed in Scozzafava, EP 349,265; Tang, U.S. Pat. No. 4,356,429; Van Slyke et al., U.S. Pat. No. 4,539,507; Van Slyke et al., U.S. Pat. No. 4,720,432; Tang et al., U.S. Pat. No. 4,885,211; Tang et al., U.S. Pat. No. 4,769,292; Perry et al., U.S. Pat. No. 4,950,950; Littman et al., U.S. Pat. No. 5,059,861; Van Slyke, U.S. Pat. No. 5,047,687; Scozzafava et al., U.S. Pat. No. 5,073,446; Van Slyke et al., U.S. Pat. No. 5,059,862; Van Slyke et al., U.S. Pat. No. 5,061,569; the disclosures of which are incorporated herein by reference.

The second electrode element 207 is preferably constructed of a combination of a metal having a work function less that 4.0 eV and one other metal, preferably a metal having a work function greater than 4.0 eV. Suitable cathode materials are described in the previously mentioned U.S. Pat. Nos. 4,885,211, 5,059,862, and 5,073,446, the disclosures of which are incorporated herein by reference. Mg:Al cathodes are especially preferred.

The desiccant and capping layer 208 comprises an evaporated indium film or an aluminum-organic matrix composite, as described in the previously mentioned U.S. Pat. Nos. 5,073,446 and 5,059,862, the disclosures of which are incorporated herein by reference.

Figure 5:
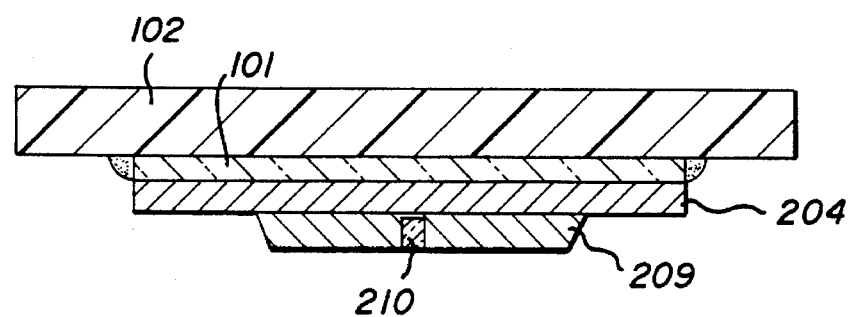
FIG. 5 is a schematic cross-sectional view of the structure of FIG. 4 inverted and with the patterned dielectric layer, EL medium, second electrode element, and capping layer schematically depicted as a single composite layer to approximate more closely the relative thickness of the structural components.

FIG. 5 depicts the structure of FIG. 4 in an inverted orientation, with the patterned dielectric layer 205, EL medium 206, second electrode element 207, and desiccant and capping layer 208 represented as a single composite layer 209 to approximate more closely the relative thickness of the structural components. The total thickness of the composite layer 209 ranges from about 1 µm to 6 µm. Also shown in FIG. 5 is the active light emitting portion 210 of a pixel; the area of the active portion is typically about 50–90 percent of the total area of the pixel.

In FIG. 6 is depicted a relatively thick (1–3 mm) rigid permanent support 110 on which is deposited an electrical conductor 111 that has been patterned in conformity with the first and second electrode elements 204 and 207, respectively. The electrical conductor 111 is preferably formed of indium tin oxide or of an evaporated metal such as Cr or Al.

Also depicted in FIG. 6 is an array of electrically conductive malleable bonding bumps 112 located on the patterned electrical conductor. The bonding bumps are preferably formed of a soft metal alloy such as an indium alloy which can be deformed by pressure and/or melted by heating.

Figure 7:
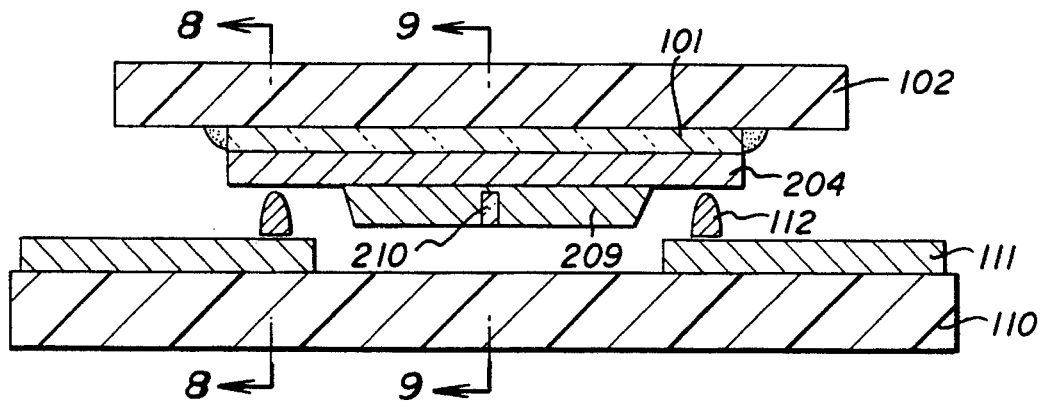
FIG. 7 is a schematic cross-sectional view depicting the contact in registration of the structures of FIGS. 5 and 6.
Figure 8:
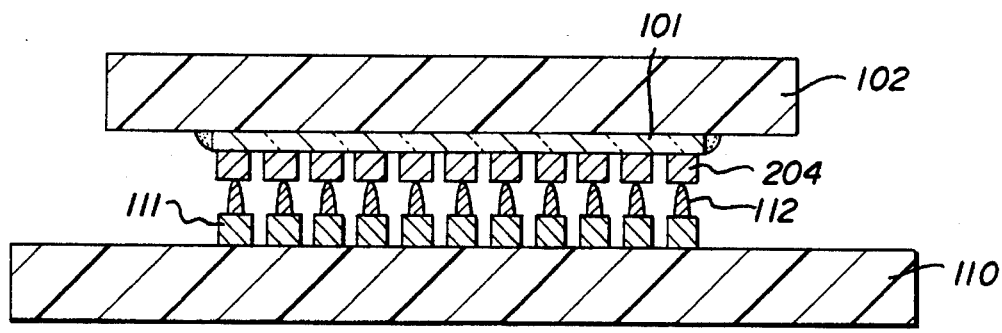
FIG. 8 is a schematic cross-sectional view along line 8—8 of FIG. 7.

FIG. 7 and FIG. 8, which is a schematic cross-sectional view along line 8—8 in FIG. 7, depicts the structures of FIGS. 5 and 6 brought into contact so that the patterned electrical conductor 111 with its projecting bonding bumps 112 is in correct registration with the first electrode elements 204. Not depicted in FIGS. 7 or 8 are the second electrode element 207 and the bonding bumps in contact with it. Bonding bumps can be positioned to contact each end of all the first electrode elements, as shown in FIGS. 7 and 8, or they can be arranged in an interdigitated configuration, where only one end of each element, in an alternating sequence, is in contact with a bonding bump.

Figure 9:
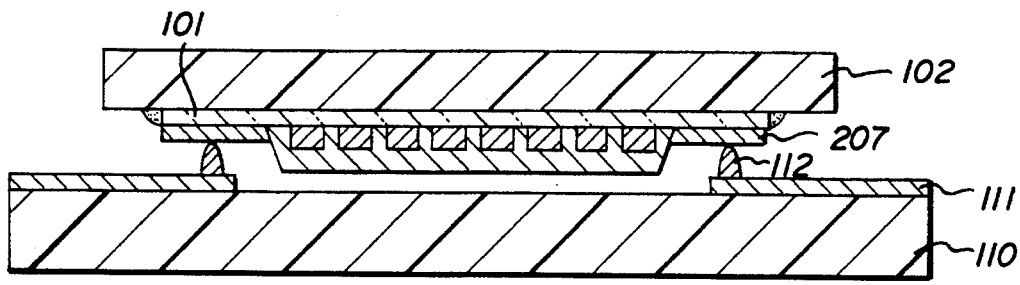
FIG. 9 is a schematic cross-sectional view along line 9—9 of FIG. 7.

FIG. 9, which is a schematic cross-sectional view along line 9—9 in FIG. 7, depicts bonding bumps 112 in registration and contact with the second electrode element 207. Not depicted in FIG. 9 is that portion of the patterned electrical conductor 111 bearing the bonding bumps that are in contact with the first electrode elements 204.

Mechanical pressure and/or localized heating can be employed to fuse the bonding bumps with the first and second electrode elements, resulting in the establishment of a physical and electrical connection between the electrical conductor and the first and second electrode elements.

Figure 10:
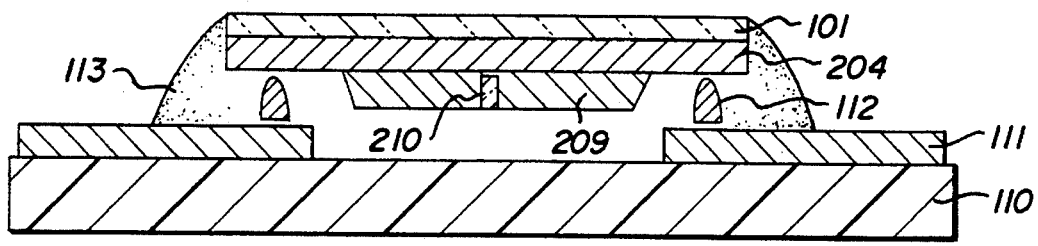
FIG. 10 is a schematic cross-sectional view of a light emitting device fabricated by the process of the invention.

FIG. 10 depicts a light emitting device 100 fabricated by the process of the invention, in which the final step is delamination of the rigid temporary support 102 from the ultra thin substrate 101. Not shown in FIG. 10 are the second electrode element 207 or that portion of the patterned electrical conductor in contact with it. Optionally, a transparent and electrically insulative sealant material 113 may be introduced into the space between the ultra thin substrate 101 and the electrical conductor 111 on the permanent support 110 to provide a moisture barrier and improve the mechanical strength of the structure. The sealant can be applied in a fluid state and subsequently caused or allowed to harden. Suitable sealant materials include, for example, epoxy resins, hot melt adhesives, and UV-curable adhesives.

The use of glass as the ultra thin substrate 101 provides an abrasive-resistant surface beneficial for contact printing. If desired, the glass surface can be further modified with a slipping layer such as a thin film of Teflon™.

Although the rigid temporary and permanent supports 102 and 110, respectively, have been represented in the drawings as flat, they can also be curved. An appropriately curved surface may be advantageous for paper transport in contact printing.

The invention has been described in detail with particular reference to preferred embodiments thereof, but it will be understood that variations and modifications can be effected within the spirit and scope of the invention.

| PARTS LIST | |
|---|---|
| 100 | light emitting device |
| 101 | ultra thin substrate |
| 102 | rigid temporary support |
| 103 | adhesive |
| 104 | first electrode |
| 105 | dielectric layer |
| 110 | rigid permanent support |
| 111 | electrical conductor |
| 112 | bonding bump |
| 113 | sealant |
| 204 | first electrode element |
| 205 | patterned dielectric layer |
| 206 | electroluminescent (EL) medium |
| 207 | second electrode element |
| 208 | desiccant and capping layer |
| 209 | composite layer |
| 210 | light emitting portion of pixel |

What is claimed is:

1. A process for forming a light-emitting device that comprises an organic LED array containing a plurality of light emitting pixels having a pitch; a plurality of light transmissive first electrode elements located on a common electrically insulative transparent substrate, each first electrode element being laterally spaced and electrically insulated from an adjacent first electrode element; an organic electroluminescent medium located on a supporting surface formed by the substrate and every first electrode element; and a second electrode element located on said organic electroluminescent medium, said pixels each including a first electrode element and a second electrode element, which comprises the following steps:

(a) releasably laminating to an ultra thin electrically insulating transparent substrate a relatively thick rigid temporary support wherein the ultra thin electrically insulating transparent substrate has a thickness less than the pitch of said pixels;

(b) forming said organic LED array on said ultra thin substrate;

(c) forming on a relatively thick rigid permanent support an electrical conductor patterned in conformity with said first and second electrode elements located on said ultra thin substrate;

(d) forming an array of electrically conductive malleable bonding bumps on said patterned electrical conductor located on said permanent support;

(e) aligning said first and second electrode elements located on said ultra thin substrate in correct registration with said patterned conductor located on said permanent support;

(f) contacting said bonding bumps on said conductor with said first electrode and second electrode elements;

(g) forming a physical and electrical connection between said bonding bumps and said first electrode and second electrode elements; and (h) delaminating said temporary support from said ultra thin transparent substrate.

2. A process according to claim 1 wherein said pixels are arranged in a plurality of intersecting columns and rows; said pixels in each column contain and are joined by a common first electrode element and said pixels in each row contain and are joined by a common second electrode element; each second electrode element being laterally spaced and electrically insulated from an adjacent second electrode element.

3. A process according to claim 1 wherein said pixels are arranged in a line array.

4. A process according to claim 1 further comprising the step of introducing a transparent and electrically insulative sealant material into the space between said ultra thin substrate and said electrical conductor on said permanent support.

5. A process according to claim 1 wherein said ultra thin substrate is glass.

6. A process according to claim 5 wherein said ultra thin substrate has a thickness of up to about 150 μm.

7. A process according to claim 6 wherein said ultra thin substrate has a thickness of about 25 μm to 50 μm.

8. A process according to claim 1 wherein said rigid temporary and permanent supports are glass.

9. A process according to claim 8 wherein said supports have a thickness of about 1 mm to 3 mm.

10. A process according to claim 8 wherein said supports have a curved surface.

11. A process according to claim 1 wherein said ultra thin substrate is plastic.

12. A process according to claim 1 wherein said ultra thin substrate is laminated to said temporary support by means of an adhesive.

13. A process according to claim 12 wherein said adhesive is a hot melt adhesive.

14. A process according to claim 1 wherein said patterned electrical conductor is formed from indium tin oxide or an evaporated metal.

15. A process according to claim 14 wherein said metal is Cr or Al.

16. A process according to claim 1 wherein said bonding bumps are formed from a soft metal alloy.

17. A process according to claim 16 wherein said metal alloy is an indium alloy.

18. A process according to claim 1 wherein said physical and electrical connection between said bonding bumps and said first electrode element is formed by applying heat, pressure, or a combination of both heat and pressure.

19. A process according to claim 4 wherein said sealant material is introduced in a fluid state and is subsequently caused or allowed to harden.

20. A process according to claim 1 wherein said sealant material is an epoxy resin, a hot melt adhesive, or a UV-curable adhesive.

* * * * *